US006377106B1

(12) United States Patent
Rozsypal

(10) Patent No.: US 6,377,106 B1
(45) Date of Patent: Apr. 23, 2002

(54) CIRCUIT AND METHOD OF MAXIMUM VOLTAGE BIAS CONTROL

(75) Inventor: Antonin Rozsypal, Hutisko-Solanec (CZ)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 09/728,750

(22) Filed: Dec. 4, 2000

(51) Int. Cl.[7] ..................... H03K 17/687; H03K 19/003

(52) U.S. Cl. ......................... 327/333; 327/306; 326/80; 326/68

(58) Field of Search ................................ 327/333, 530, 327/544, 143, 427, 306; 326/63, 68, 80, 82

(56) References Cited

U.S. PATENT DOCUMENTS

| | | | | | |
|---|---|---|---|---|---|
| 5,448,198 | A | * | 9/1995 | Toyoshima et al. | 327/534 |
| 5,457,420 | A | * | 10/1995 | Asada | 327/333 |
| 6,043,699 | A | * | 3/2000 | Shimizu | 327/333 |
| 6,057,718 | A | * | 5/2000 | Keeth | 327/333 |
| 6,323,704 | B1 | * | 11/2001 | Pelly et al. | 327/112 |

* cited by examiner

*Primary Examiner*—Dinh T. Le

(57) ABSTRACT

A maximum voltage bias control circuit (22) is provided which accepts two supply voltages ($V_{batt}$ and $V_{out}$) and determines the maximum voltage. The maximum voltage is then applied to terminal ($V_{max}$) with current drivers (46,50) used to provide additional current drive to terminal ($V_{max}$). PMOS transistors (40,42) are used to provide proper N-Well bias control of PMOS transistors (40, 42, 46 and 50).

15 Claims, 3 Drawing Sheets

CIRCUIT AND METHOD OF MAXIMUM VOLTAGE BIAS CONTROL

FIELD OF THE INVENTION

The present invention relates, in general, to voltage selection circuits, and more particularly, to voltage selection circuits which select the maximum voltage of two input voltage supply potentials and provide the maximum voltage at the output with additional current drive.

BACKGROUND OF THE INVENTION

Complimentary MOS (CMOS) processing is used for semiconductors which employ both N-type and P-type devices. The N-type and P-type devices coexist on the same substrate through the use of well regions. The well regions act as isolation boundaries between the N-type and P-type devices and are typically electrically shorted to either the source or drain regions. CMOS devices are used, for example, for up/down, DC-DC voltage regulator controller applications. Both N-type and P-type MOS Field Effect Transistors, NMOS and PMOS, respectively, are used to control current flow from the voltage source, typically a battery. The NMOS device, for example, is typically used to conduct current from the voltage supply or battery to charge the inductor during up-conversion mode. The PMOS device, for example, is then used to conduct current from the inductor during the discharge cycle of the inductor. Since the MOS devices are used in an up/down voltage converter, two sources of supply voltage exists within the converter. In an up-conversion mode, the input voltage is at a lower potential than the output voltage. In a down conversion mode, the output voltage is at a lower potential than the input voltage. In either case, a maximum supply potential exists, input voltage or output voltage, which should be used to control the switching devices during regulation.

Prior art up/down, DC-DC converters which employ the PMOS and NMOS switch topology, typically employ a fixed logic supply potential to supply the top rail supply voltage to the control logic. Using a fixed logic supply potential, however, causes additional switching losses, since the fixed supply voltage must be larger than either the input or output voltages and larger than required gate voltages are used. A need exists, therefore, for a maximum voltage bias control device, which is capable of determining the maximum of two supply potentials and delivering the maximum potential, with additional current drivers, as the supply voltage to be used by the switch control circuitry.

DETAILED DESCRIPTION OF THE DRAWINGS

Figure 1:
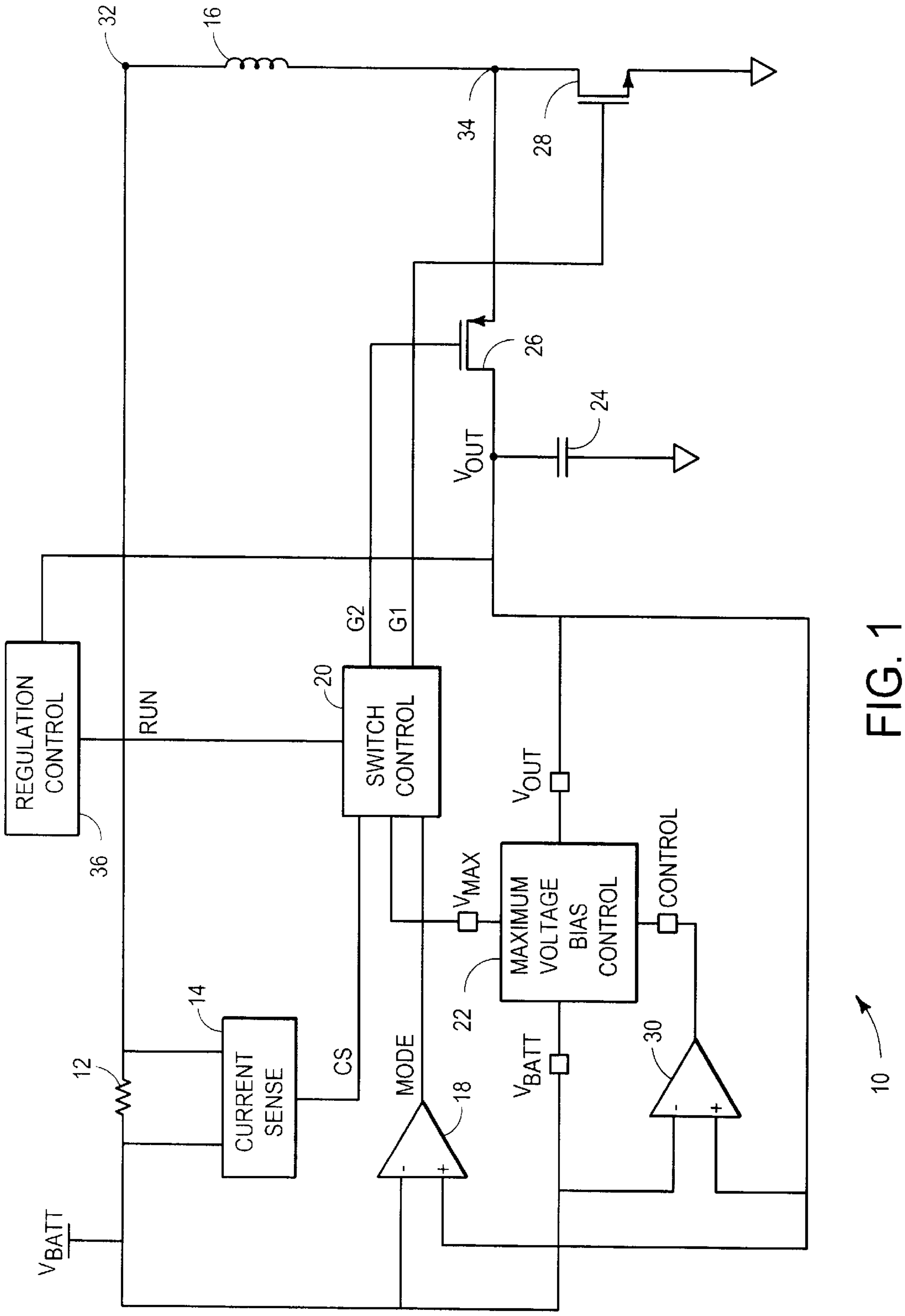
FIG. 1 illustrates a schematic diagram of an up/down, DC-DC converter.

FIG. 1 illustrates an up/down, DC-DC converter 10 utilizing Metal Oxide Semidonductor Field Effect Transistors (MOSFET) 28 and 26, in conjunction with inductor 16 and associated regulation control circuits. In general, converter 10 regulates the output voltage $V_{OUt}$ to a substantially constant voltage level, while accepting the input voltage $V_{batt}$ from a battery. $V_{out}$ is either regulated to a potential lower than the battery voltage, down-conversion, or is regulated to a potential higher than the battery voltage, up-conversion.

In operation, converter 10 accepts an input voltage from a battery at node $V_{batt}$. The battery voltage is typically in the range of approximately 2.7 volts to 6 volts. The output voltage, $V_{out}$, is regulated to, for example, 5 volts. Converter 10 will be in up-conversion mode for battery voltage, $V_{batt}$, less than 5 volts. Converter 10 will be in down-conversion mode for battery voltage, $V_{batt}$, greater than 5 volts. Converter 10 automatically detects the potential relationship between $V_{batt}$ and $V_{out}$, through the operation of comparator 18. Comparator 18 receives the output voltage at the non-inverting input, from terminal $V_{out}$. Comparator 18 receives the battery voltage at the inverting input from terminal $V_{batt}$. Comparator 18 has a built-in input offset voltage equal to approximately 200 millivolts (mV). The offset voltage is required to assure continuous function of converter 10 when $V_{batt}$ and $V_{out}$ are approximately at the same potential. Down-conversion mode requires at least a 200 mV differential between $V_{batt}$ and $V_{out}$ in order to properly function while up-conversion mode can overlap this range. Comparator 18, in addition, has built in hysteresis, for example 20 mV, which prevents the MODE signal from oscillating between logic high and low voltages when $V_{batt}$ and $V_{out}$ are approximately the same. The conversion mode represented by the MODE signal presented by comparator 18, therefore, is related to input voltages $V_{batt}$ and $V_{out}$ according to Table 1.

TABLE 1

| Input Voltage | Mode |
|---|---|
| $V_{out}$ > = $V_{batt}$ − 200 mV | UP-Conversation (Logic High) |
| $V_{out}$ < $V_{batt}$ − 200 mV | DOWN-Conversion (Logic Low) |

Down conversion mode of converter 10 exists when the battery voltage, $V_{batt}$, is at a higher potential than $V_{out}$. Maximum voltage bias control 22, determines the maximum of the two voltages, $V_{batt}$ or $V_{out}$, and provides the maximum voltage to switch control 20 via terminal $V_{max}$. Switch control 20 then asserts $V_{max}$ as logic high levels for signals G1 and G2 At startup, $V_{Out}$ is at ground potential and $V_{batt}$ is at, for example, 6 volts. Comparator 18 sets the MODE signal to a logic low value, selecting switch control 20 to down-conversion mode. NMOS transistor 28 does not enter into a conductive state while converter 10 is in down conversion mode. PMOS transistor 26 is rendered conductive by switch control 20, by selecting G2 to be logic low. The voltage present at the source terminal of PMOS transistor 26 exceeds the threshold voltage of PMOS transistor 26 making PMOS transistor 26 conductive. PMOS transistor 26 is said to be in a first mode of conduction when signal G2 is at a logic low value. The first mode of conduction, or first phase of inductor current, is also indicated by signal CS asserted to a logic high value, indicating an inductor current, $I_L$, lower than a predetermined threshold current $I_{max}$, for example, 100 milliamps (mA). Current is conducted by inductor 16 through sense resistor 12 and PMOS transistor 26, to charge capacitor 24. At the beginning of the first phase, the inductor current, $I_L$, is zero. In the first phase, the current in the inductor varies according to the applied voltage $V_L$ across the inductor. The inductor current, $I_L$, starts to increase as $di/dt=V_L/L$, where L is the value of inductance associated with inductor 16 and di/dt is the rate of change of current flow through inductor 16. The applied voltage across inductor 16 is approximately equal to $V_L=V_{batt}-V_{out}-V_{12}-V_{26}$, where $V_{12}$ and $V_{26}$ are voltages developed across sense resistor 12 and PMOS switch 26, respectively. Capacitor 24 is relatively large , for example, 10 uF, so the variation of $V_{out}$ during one cycle of inductor current is negligible. Current sense 14 senses the current flow through resistor 12, which is equivalent to the current flow through inductor 16 and at a predetermined amount of current flow, $I_{max}$, detects a maximum current value. The maximum current value, for example, is predetermined to be 100 mA. Once $I_{max}$ is detected by current sense 14, signal CS is set to a logic low value by current sense 14, indicating that the predetermined maximum inductor current, $I_{max}$, is obtained and a second phase of inductor current begins. Signal G2 is set to a logic high value, approximately equal to $V_{batt}$, since $V_{batt}$ is at a potential greater than $V_{out}$.

A logic high value for signal G2, changes the conduction mode of PMOS transistor 26 to a second mode. PMOS transistor 26 is momentarily rendered non-conductive by the mode change. Inductor 16 however, contains stored magnetic energy, which inverts the voltage polarity across inductor 16 to create a voltage rise from node 32 to node 34. The potential at node 34, the source terminal of PMOS transistor 26, exceeds the threshold voltage of PMOS transistor 26, since the gate terminal of PMOS transistor 26 is set to approximately $V_{batt}$ by signal G2 and the source terminal exceeds $V_{batt}$ by at least the threshold voltage of PMOS device 26. The polarity of the inductor voltage inverts, which changes the sign of the di/dt term for the equation of $V_L$ above, creating a decreasing inductor current. The second mode of operation renders PMOS transistor 26 conductive once again, but the inductor current is now decreasing from the predetermined maximum value of current flow, $I_{max}$, toward a predetermined minimum value of current flow, $I_{min}$. Once the current flow has decreased to $I_{min}$, for example 50 mA, current sense 14 asserts signal CS to a logic high value and switch control 20, de-asserts signal G2 (becoming again logic low), rendering PMOS transistor 26 conductive in the first conduction mode. It can be seen, therefore, that PMOS transistor 26 alternates between two modes of conduction states. The first mode of conduction of PMOS transistor 26 creates an increasing inductor current, $I_L$, indicating a first phase of the inductor current waveform and the second mode of conduction of PMOS transistor 26 creates a decreasing inductor current, indicating a second phase of the inductor current waveform. The inductor current waveform increases from $I_{min}$ to $I_{max}$ during a first phase of the current waveform and decreases from $I_{max}$ to $I_{min}$ during a second phase of the current waveform. While converter 10 is supplying drive current to the load connected to terminal $V_{out}$ (not shown), during first or second phases of the inductor current waveform, converter 10 is said to be in a constant current mode of operation. Signal RUN is asserted to a logic high value by regulation control 36 during the constant current mode of operation.

Since converter 10 is in a down-conversion mode, $V_{out}$ is regulated to some potential below $V_{batt}$−200 mV. Converter 10, for example, regulates from voltage $V_{batt}$ approximately equal to 6 volts to voltage $V_{out}$ approximately equal to 5 volts. Once the output voltage $V_{out}$ has reached the predetermined output voltage of 5 volts, for example, converter 10 changes to a skip mode of operation. Skip mode of operation is defined to be a mode of operation whereby no current is conducted by inductor 16 and the inductor current, $I_L$, falls to 0 amps. The energy stored in capacitor 24 supplies power to the load (not shown) connected to node $V_{out}$. The skip mode of operation is set by regulation control 36, via signal RUN, when $V_{out}$ has obtained a predetermined voltage value. Signal RUN is set to a logic high value to enable constant current mode of operation for converter 10 and is set to a logic low value to enable skip mode operation.

As discussed above, $V_{batt}$ is a voltage supply potential derived from a battery. The magnitude of $V_{batt}$ will decrease as the amount of charge contained within the battery decreases. As the magnitude of $V_{batt}$ decreases below the voltage required at terminal $V_{out}$, converter 10 automatically changes conversion mode from down-conversion to up-conversion. Comparator 18 asserts signal MODE to a logic high value and switch control 20 activates signals G1 and G2 accordingly as needed for up-conversion. Maximum voltage bias control 22 determines $V_{out}$ is the maximum voltage as compared to $V_{batt}$ and delivers $V_{out}$ to terminal $V_{max}$. Switch control 20 then asserts signals G1 and G2 with logic high voltage levels equal to $V_{out}$, as opposed to $V_{batt}$, accordingly.

Up-conversion mode engages both NMOS transistor 28 and PMOS transistor 26. At startup, $V_{out}$ is at ground potential and $V_{batt}$ is at, for example, 3 volts. Since $V_{out}$ is at a potential lower than $V_{batt}$, the MODE signal is at a logic low value, which indicates down-conversion mode. The voltage at $V_{out}$ increases as described earlier for down-conversion mode at start up. As the output voltage at node $V_{out}$ increases to a voltage approximately equal to $V_{batt}$−200 mV, the MODE signal reverses from indicating down-conversion mode to indicating up-conversion mode, or a logic high value. Regulation control 36 maintains the RUN signal to a logic high value, since the output voltage has not yet reached the predetermined value of, for example, 5 volts. Once the MODE signal has transitioned to indicate up-conversion mode, switch control 20 asserts signal G1 accordingly. As converter 10 transitions from down to up-conversion mode, the voltage at terminal $V_{out}$ approximates $V_{batt}$ −200 mV. Signals G1 and G2 are asserted to a logic high, or Vout, rendering NMOS transistor 28 conductive and PMOS transistor 26 non-conductive. Inductor 16 continues to store magnetic energy as the inductor current waveform continues to increase from $I_{min}$ to $I_{max}$, which are predetermined values set by current sense 14 as described earlier. NMOS transistor 28 conducts the inductor current until the inductor current reaches $I_{max}$. Once the inductor current reaches $I_{max}$, NMOS transistor 28 is rendered non-conductive by switch control 20 by de-asserting signal G1 to a logic low value and PMOS transistor 26 is rendered conductive by de-asserting signal G2 to a logic low value. The voltage developed across inductor 16 inverts, maintaining a source voltage at PMOS transistor 26 which exceeds the threshold voltage of PMOS transistor 26. Since PMOS transistor 26 is conductive, inductor 16 continues to supply drive current to charge capacitor 24, with decreasing drive current towards $I_{min}$, consistent with phase two of the current waveform discussed above. Once the current waveform has reached $I_{min}$, phase one of the current waveform repeats to continue the continuous current mode of operation. The voltage across capacitor 24, $V_{out}$, continues to increase toward the predetermined value set by regulation control 36, for example, 5 volts. Once the output voltage has reached 5 volts, regulation control 36 de-asserts signal RUN, programming converter 10 to a skip mode of operation, whereby no current is conducted by either NMOS transistor 28 or PMOS transistor 26. The energy stored in capacitor 24 delivers the required power to the load connected to node $V_{out}$ (not shown). Once the voltage at node $V_{out}$ has transitioned below a predetermined value set by regulation control 36, signal RUN is asserted by regulation control 36 and continuous current mode resumes.

Maximum voltage bias control 22 and comparator 30 work in combination to determine the maximum voltage, $V_{batt}$ or $V_{out}$. Once the maximum voltage has been ascertained, the maximum voltage is applied to terminal $V_{max}$ of maximum voltage bias control 22 and current drivers are invoked to supply the current demanded by logic internal to switch control 20. Comparator 30 operates from a top rail voltage supply equal to $V_{batt}$ regardless of the magnitude relationship to $V_{out}$. In other words, comparator 30 receives top rail supply voltage from $V_{batt}$ even if $V_{batt}$ is lower in magnitude as compared to $V_{out}$. Hysteretic comparator 30 indicates a logic high ($V_{batt}$) at the output of comparator 30 when $V_{out}$ is at a higher magnitude as compared to $V_{batt}$. Conversely, hysteretic comparator 30 indicates a logic low level when $V_{batt}$ is at a higher magnitude as compared to $V_{out}$.

Figure 2:
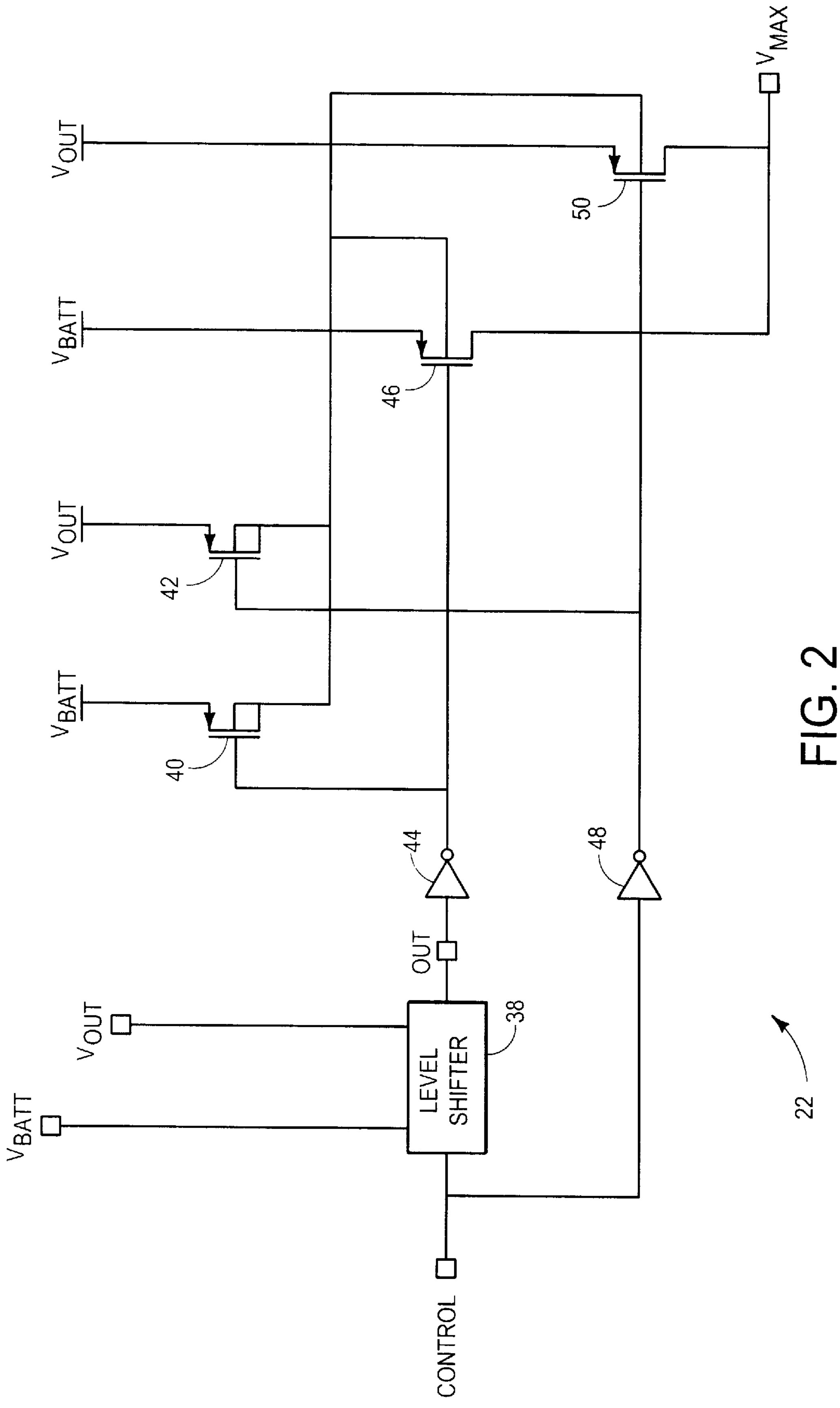
FIG. 2 illustrates the maximum voltage bias control circuit of FIG. 1.

FIG. 2 illustrates a detailed schematic of maximum voltage bias control 22. Level shifter 38 accepts both $V_{batt}$ and $V_{out}$. The control input to level shifter 38 accepts signal CONTROL and the output of level shifter 38 is coupled to the input of inverter 44 at terminal OUT. The input of inverter 48 is coupled to terminal CONTROL. The output of inverter 44 is coupled to the control terminal of PMOS transistors 40 and 46. The output of inverter 48 is coupled to the control terminal of PMOS transistors 42 and 50. The source terminal of PMOS transistors 40 and 46 are coupled to the $V_{batt}$ terminal. The source terminal of PMOS transistors 42 and 50 are coupled to terminal $V_{out}$. The N-Well bias terminals of each PMOS transistor 40, 42, 46 and 50 are coupled together at the drain terminal of transistors 40 and 42. The drain terminal of transistors 46 and 50 are coupled together at terminal $V_{max}$.

Figure 3:
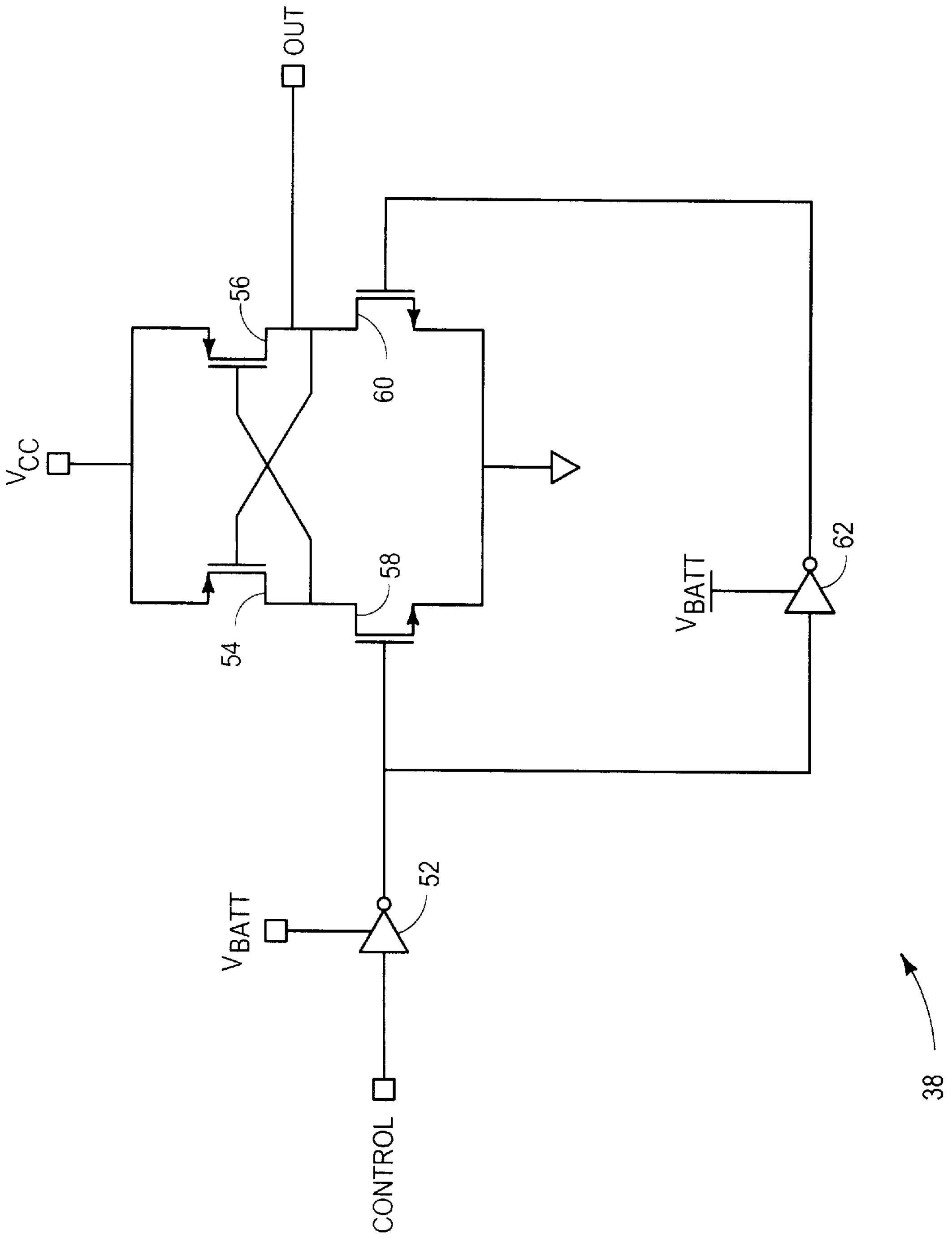
FIG. 3 illustrates the level shifter of FIG. 2.

Level shifter 38 is illustrated in FIG. 3. The input of inverter 52 is coupled to the CONTROL terminal. The output of inverter 52 is coupled to the input of inverter 62 and the gate terminal of NMOS transistor 58. Inverters 52 and 62 derive top rail supply potential from terminal $V_{batt}$. The output of inverter 62 is coupled to the gate terminal of NMOS transistor 60. The source terminal of NMOS transistors 58 and 60 are coupled to the bottom rail potential, for example, ground potential. The drain terminal of NMOS transistor 58 is coupled to the gate terminal of PMOS transistor 56 and to the drain terminal of PMOS transistor 54. The drain terminal of NMOS transistor 60 is coupled to the gate terminal of PMOS transistor 54 and to the drain terminal of PMOS transistor 56. The source terminal of PMOS transistors 54 and 56 is coupled to the $V_{cc}$ terminal. The output of level shifter 38 is derived at the drain terminal of transistors 56 and 60 at terminal OUT.

In operation, level shifter 38 receives a logic low signal at terminal CONTROL. Inverter 52 provides a logic high, $V_{batt}$, signal to the gate terminal of NMOS transistor 58. The output of inverter 62 is at a logic low. Consequently, NMOS transistor 58 is conductive and NMOS transistor 60 is non-conductive. Since transistor 58 is conductive, the source terminal of PMOS transistor 56 exceeds the potential at the gate terminal of PMOS transistor 56 by more than the threshold voltage of PMOS transistor 56, rendering transistor 56 conductive. The voltage at terminal OUT is, therefore, substantially equal to $V_{cc}$.

Conversely, level shifter 38 receives a logic high signal at terminal CONTROL. Inverter 52 provides a logic low signal to the gate terminal of NMOS transistor 58. The output of inverter 62 is at a logic high, $V_{batt}$. Consequently, NMOS transistor 60 is conductive and NMOS transistor 58 is non-conductive. Since transistor 60 is conductive, a voltage substantially equal to ground potential is applied to terminal OUT, resulting in a logic low output signal. It can be seen, therefore, that level shifter 38 is an inverting level shifter.

In operation, maximum voltage bias control 22 accepts signal CONTROL, which is at a logic high value indicative of up-conversion mode and at a logic low value indicative of down-conversion mode. Signal CONTROL is delivered by comparator 30, which is operating from a top rail supply potential equal to $V_{batt}$. Logic levels output from comparator 30, therefore, operate from ground potential (logic low) to $V_{batt}$ (logic high) . Level shifter 38 is an inverting level shifter which shifts logic low levels at the input to logic high levels at the output. Level shifter 38 performs level shifting to an output logic high level of $V_{out}$, for a logic low input, and a logic low level of ground potential, for a logic high input. Inverter 44 operates from a top rail supply potential equal to VOut and inverter 48 operates from a top rail supply potential equal to $V_{batt}$. The logic high level, therefore, for inverter 44 is equal to $V_{out}$ and for inverter 48 is equal to $V_{batt}$. Level shifter 38, inverter 44 and inverter 48 comprise an input stage to maximum voltage bias control 22. PMOS transistor 40 is responsible for properly biasing the N-Well terminal of PMOS transistors 40, 42, 46 and 50, when $V_{batt}$ is greater than $V_{out}$. Proper N-Well bias control is necessary to prevent the well known latch up condition prevalent in CMOS devices. PMOS transistor 42, on the other hand, is responsible for properly biasing the N-Well terminals of PMOS transistors 40, 42, 46 and 50, when $V_{out}$ is greater than $V_{batt}$. PMOS transistors 40 and 42 form a well biasing stage of maximum voltage bias control 22. PMOS transistors 46 and 50 comprise the output current drivers for maximum voltage bias control 22. PMOS transistor 46 delivers $V_{batt}$ to terminal $V_{max}$ when $V_{batt}$ exceeds $V_{out}$. Conversely, PMOS transistor 50 delivers $V_{out}$ to terminal $V_{max}$ when $V_{out}$ exceeds $V_{batt}$. PMOS transistors 46 and 50 comprise an output drive stage of maximum voltage bias control 22.

A logic high level, $V_{batt}$, is delivered to the CONTROL terminal, by comparator 30, when up-conversion mode is active. Level shifter 38 inverts the CONTROL signal to a logic low level and provides the logic low signal to the OUT terminal. Inverter 44 provides a logic high level, $V_{out}$, and inverter 48 provides a logic low level equal to ground potential. Since $V_{out}$ exceeds $V_{batt}$, the output potential from inverter 44 makes the gate terminal of transistors 40 and 46 more positive than their respective source terminals. PMOS transistors 40 and 46 are therefore rendered non-conductive. The logic low level from inverter 48 produces a gate voltage which is less than the voltage present at the source terminals of transistors 42 and 50. PMOS transistors 42 and 50 are therefore rendered conductive. PMOS transistor 42, as discussed above, properly biases the N-Well regions of transistors 40, 42, 46 and 50 to a voltage substantially equal to $V_{out}$, since $V_{out}$ exceeds $V_{batt}$. PMOS transistor 50 is larger than PMOS transistor 42 and has greater current conduction capability. PMOS transistor 50, therefore, provides voltage $V_{out}$ to terminal $V_{max}$ and provides enough current drive to support the current requirements of switch control 20.

A logic low level, ground potential, is delivered to the CONTROL terminal, by comparator 30, when down-conversion mode is active. Level shifter 38 inverts the CONTROL signal to a logic high level, $V_{out}$, and provides the logic high signal to terminal OUT. Inverter 44 provides a logic low level, ground potential, and inverter 48 provides a logic high level, $V_{batt}$. Since $V_{batt}$ exceeds $V_{out}$, the output potential from inverter 48 places a voltage at the gate terminal of transistors 42 and 50 which is more positive than their respective source terminals. PMOS transistors 42 and 50 are therefore rendered non-conductive. The logic low level from inverter 44 produces a gate voltage which is less than the voltage present at the source terminals of transistors 40 and 46. PMOS transistors 40 and 46 are therefore rendered conductive. PMOS transistor 40, as discussed above, properly biases the N-Well regions of transistors 40, 42, 46 and 50 to a voltage substantially equal to $V_{batt}$, since $V_{batt}$ exceeds $V_{out}$. PMOS transistor 46 is larger than PMOS transistor 40 and has greater current conduction capability. PMOS transistor 46, therefore, provides voltage $V_{batt}$ to terminal $V_{max}$ and provides enough current drive to support the current requirements of switch control 20.

By now it should be appreciated that a maximum voltage bias control circuit has been presented which provides the maximum voltage of two input voltages at an output terminal and provides additional current drive to the output terminal. An advantage of the bias control circuit is that the most positive voltage supply can be provided to a logic circuit responsible for controlling the conductive state of a PMOS transistor. An additional advantage is that proper N-Well bias control of internal PMOS transistors is maintained.

What is claimed is:

1. A bias control circuit used in an up-down voltage converter to supply power from one of two available supply potentials, the bias control circuit comprising:

a level shifter circuit having an input coupled to receive an external control signal at a first level and an output coupled to provide a first control signal at a second level, wherein the level shifter circuit comprises a first transistor pair coupled to receive the external control signal and coupled to provide the first control signal at the second level at a first node and a second transistor pair coupled to receive the external control signal;

a logic circuit coupled to receive the external control signal and coupled to provide a second control signal at the first level; and a bias circuit coupled to receive the first and second control signals and coupled to provide first and second bias signals.

2. The bias circuit of claim 1 wherein the first transistor pair comprises:

a first transistor having a control terminal coupled to receive the external control signal, a first conduction terminal coupled to a first supply potential and a second conduction terminal coupled to provide a first conduction control signal; and a second transistor having a control terminal coupled to receive the first conduction control signal, a first conduction terminal coupled to a second supply potential and a second conduction terminal coupled to provide the first control signal at the first node.

3. The bias circuit of claim 2 wherein the second transistor pair comprises:

a first transistor having a control terminal coupled to receive the external control signal, a first conduction terminal coupled to a first supply potential and a second conduction terminal coupled to the first node; and a second transistor having a control terminal coupled to the first node and a first conduction terminal coupled to a second supply potential.

4. The bias control circuit of claim 1 wherein the level shifter circuit includes an inverter having a supply voltage input coupled to receive a first supply potential.

5. The bias control circuit of claim 3 wherein the first transistor of the first transistor pair includes a p-type metal oxide semiconductor field effect transistor.

6. The bias control circuit of claim 3 wherein the second transistor of the first transistor pair includes a p-type metal oxide semiconductor field effect transistor.

7. The bias control circuit of claim 3 wherein the first transistor of the second transistor pair includes a p-type metal oxide semiconductor field effect transistor.

8. The bias control circuit of claim 3 wherein the second transistor of the second transistor pair includes a p-type metal oxide semiconductor field effect transistor.

9. A maximum voltage bias control circuit, comprising:

an input stage coupled to receive an external control signal and coupled to provide first and second control signals at first and second levels, and including a level shifter circuit coupled to receive the external control signal and coupled to provide a level shifted control signal, a first logic gate coupled to receive the level shifted control signal and coupled to provide the first control signal, a second logic gate coupled to receive the external control signal and coupled to provide the second control signal;

a bias stage coupled to receive the first and second control signals and coupled to provide a first bias signal at a first node; and an output stage coupled to receive the first and second control signals and the first bias signal and coupled to provide a second bias signal at a second node.

10. The maximum voltage bias control circuit of claim 9 wherein the bias stage comprises:

a first transistor having a first conduction terminal coupled to receive a first supply potential, a second conduction terminal coupled to the first node, a well region terminal coupled to the first node and a control terminal coupled to receive the first control signal; and a second transistor having a first conduction terminal coupled to receive a second supply potential, a second conduction terminal coupled to the first node, a well region terminal coupled to the first node and a control terminal coupled to receive the second control signal.

11. The bias stage of claim 10 wherein the first transistor includes a p-type metal oxide semiconductor field effect transistor.

12. The bias stage of claim 10 wherein the second transistor includes a p-type metal oxide semiconductor field effect transistor.

13. The maximum voltage bias control circuit of claim 9 wherein the output stage comprises:

a first transistor having a first conduction terminal coupled to receive a first supply potential, a second conduction terminal coupled to the second node, a well region terminal coupled to the first node and a control terminal coupled to receive the first control signal; and a second transistor having a first conduction terminal coupled to receive a second supply potential, a second conduction terminal coupled to the second node, a well region terminal coupled to the first node and a control terminal coupled to receive the second control signal.

14. The bias control circuit of claim 13 wherein the first transistor includes a p-type metal oxide semiconductor field effect transistor.

15. The bias control circuit of claim 13 wherein the second transistor includes a p-type metal oxide semiconductor field effect transistor.

* * * * *